United States Patent [19]

Gritton

[11] Patent Number: 4,468,640

[45] Date of Patent: Aug. 28, 1984

[54] ADAPTIVE FILTER UPDATE NORMALIZATION

[75] Inventor: Charles W. K. Gritton, North Brunswick, N.J.

[73] Assignee: AT&T Bell Laboratories, Murray Hill, N.J.

[21] Appl. No.: 393,122

[22] Filed: Jun. 28, 1982

[51] Int. Cl.³ ............................................. H03H 15/00
[52] U.S. Cl. ................................. 333/166; 333/17 R; 333/17 L; 333/174
[58] Field of Search ...................... 333/17 R, 17 L, 18, 333/20, 28 R, 138–140, 165–167, 174; 328/150–151, 155, 162, 163, 165–167; 179/170.2

[56] References Cited

U.S. PATENT DOCUMENTS

| | | | |
|---|---|---|---|
| 3,553,606 | 1/1971 | Port | 333/28 X |
| 3,577,089 | 5/1971 | Gerog | 328/165 |
| 3,908,896 | 9/1975 | Monrolin | 328/165 X |
| 3,922,505 | 11/1975 | Hoge | 179/170.2 |
| 3,967,102 | 6/1976 | McCown | 337/14 X |
| 4,417,317 | 11/1983 | White et al. | 333/165 X |

OTHER PUBLICATIONS

"A Twelve-Channel Digital Echo Canceler" by Donald L. Duttweiler, IEEE Transactions on Communications, vol. COM-26, No. 5, pp. 647–653, May 1978.

Primary Examiner—Marvin L. Nussbaum
Attorney, Agent, or Firm—Thomas Stafford

[57] ABSTRACT

Loop gain normalization is employed in adaptive filters to control weighting of the filter characteristic updates in order to converge properly to a desired filter characteristic. Filter instability is avoided during intervals that transient or other rapidly pulsating signals are received or inputted by normalizing the update gain with a representation of a so-called fast attack estimate of a prescribed characteristic of the input signal. In one embodiment the fast attack estimate is the maximum of a plurality of power estimates generated from a corresponding plurality of subsets of amplitude samples of the received signal. In another embodiment, the maximum of the magnitude representations of the input signal samples is modified to represent the fast attack power estimate of the received signal.

16 Claims, 3 Drawing Figures

ADAPTIVE FILTER UPDATE NORMALIZATION

RELATED APPLICATIONS

Copending application, Ser. No. 393,124, was filed concurrently herewith.

TECHNICAL FIELD

This invention relates to adaptive filters and, more particularly, to updating of the filter characteristic during reception of prescribed signals.

BACKGROUND OF THE INVENTION

Adaptive filters operate on a signal supplied thereto in accordance with a prescribed criterion to generate a desired output signal. Typically, the filters generate a transfer function (an impulse response characteristic) in accordance with an algorithm which includes updating of the transfer function characteristic in response to an error signal. In this way the filter characteristic is optimized to yield the desired result.

It has been found advantageous to normalize the update gain of the adaptive filter. The normalization serves to make the performance of the filter insensitive to variations in received signal power. In one prior arrangement an average of the squares of input signal sample magnitudes is used to normalize the gain, as described in an article by Mr. D. L. Duttweiler entitled "A Twelve-Channel Digital Echo Canceler", *IEEE Transactions on Communications*, Vol. COM-26, No. 5, May 1978, pp. 647-653. Another gain normalization arrangement employing a sum of the squares power estimate is disclosed in U.S. Pat. No. 3,922,505 issued Nov. 25, 1975.

Although these prior arrangements perform satisfactorily in some applications, poor performance or possibly instability results when the received signal includes transient signals, rapidly pulsating signals or the like. In telephone applications, instability may result in echo canceler filters for busy telephone signaling, multifrequency tones, other pulsating signals, data sets coming and going, or the like. The instability results because the average power estimate used in prior arrangements is relatively small for the transient signals thereby generating an update gain which is too large. Even if the filter does not become unstable, at best very poor convergence results, i.e., the characteristic converged to does not closely represent the desired characteristic. These results are undesirable.

SUMMARY OF THE INVENTION

The problems of prior adaptive filter normalization arrangements resulting from updating the filter characteristic when transient signals, rapidly pulsating signals or the like are being received or inputted are overcome, in accordance with an aspect of the invention, by normalizing gain in the filter update process with a representation of a so-called fast attack estimate of a prescribed input signal characteristic. Specifically, the fast attack estimate representative of input signal power is used to normalize the update gain. In one embodiment, the fast attack estimate is the maximum of a plurality of power estimates generated from a corresponding plurality of subsets of amplitude samples of the input signal. Each of the subsets includes a predetermined number of amplitude samples. In another embodiment, the maximum of representations of magnitudes of the plurality of input signal amplitude samples is modified to represent the fast attack power estimate of the input signal.

BRIEF DESCRIPTION OF THE DRAWINGS

The invention will be more fully understood from the following detailed description of an illustrative embodiment taken in connection with the appended figures in which.

DETAILED DESCRIPTION

Figure 1:
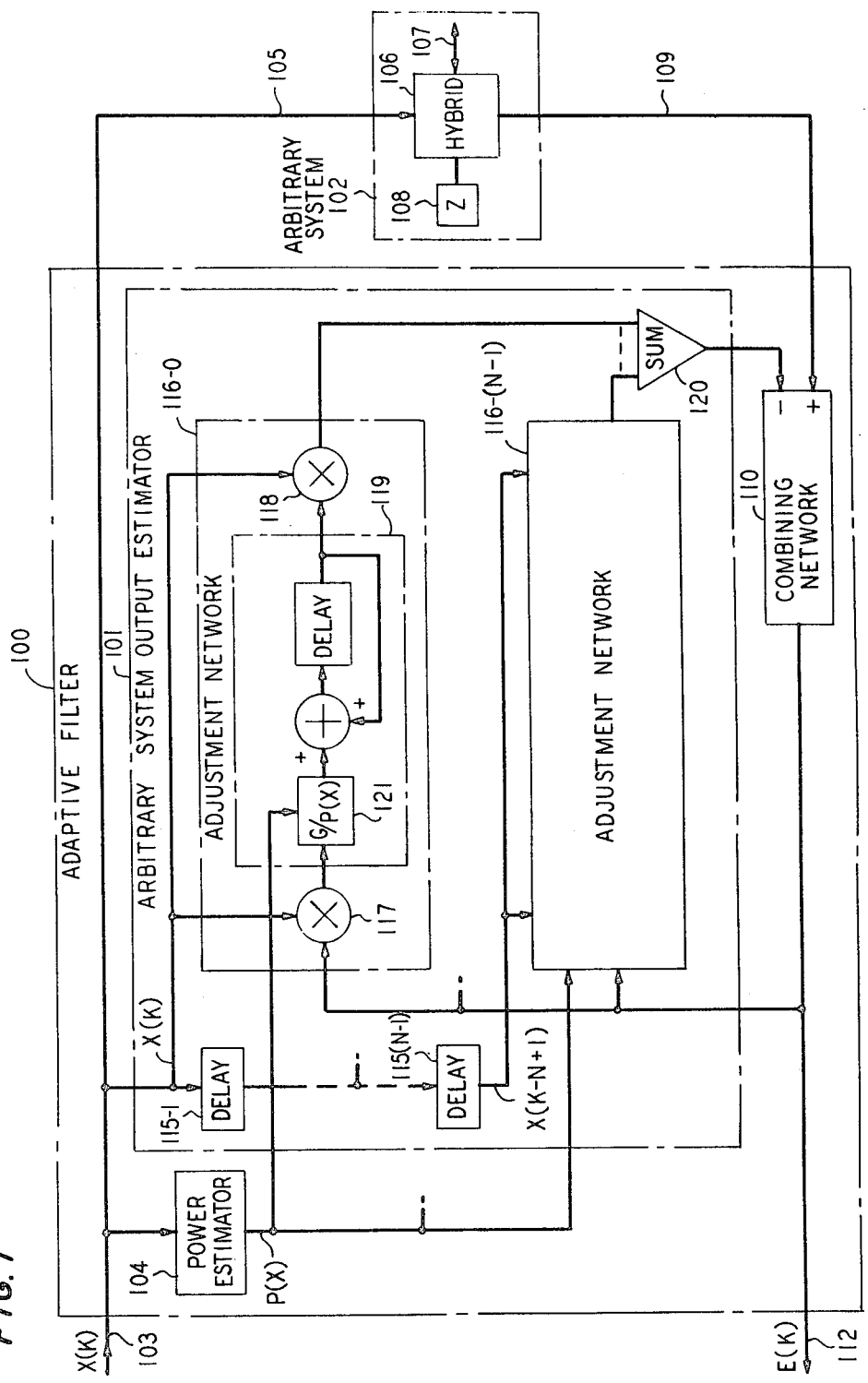
FIG. 1 shows in simplified block diagram form an adaptive filter including an embodiment of the invention.

Adaptive filter 100 including an embodiment of the invention is shown in simplified block diagram form in FIG. 1. Adaptive filter 100 is broadly similar to the adaptive filter used in echo cancelers disclosed in U.S. Pat. Nos. 3,499,999 and 3,500,000. Briefly, adaptive filter 100 includes an adjustable signal processor having a closed loop error control system which is self-adapting in that it automatically tracks signal variation in an outgoing path. More specifically, filter 100 employs arbitrary system output estimator 101 including an adaptive transversal filter arrangement for synthesizing a linear approximation of arbitrary system 102.

To this end, far end incoming signal X(K) is usually supplied from a far end signal source over a first transmission path, e.g., lead 103, to a first input of filter 100, and therein to an input of power estimator 104 and to an input of arbitrary system output estimator 101. Far end signal X(K) may be, for example, a digitally sampled speech signal, where K is an integer identifying the sampling interval. A typical sampling rate is 8 kHz used in PCM transmission. Far end signal X(K) is also supplied via lead 105, perhaps through some conversion circuitry, e.g., a digital-to-analog converter not shown, to arbitrary system 102. In an echo canceler application, arbitrary system 102 includes hybrid 106, matching impedance 108 and bidirectional transmission path 107. It is usually desirable for the input signal to hybrid 106 from lead 105 to be supplied over bidirectional path 107 to a near-end listening party. However, because of an impedance mismatch in hybrid 106, typically caused by balance impedance 108 not exactly matching the impedance of bidirectional path 107 a portion of the hybrid input signal appears on outgoing lead 109 and is reflected to the far end signal source as an echo signal. Similarly, any arbitrary system 102 will generate a system output signal which differs from that generated by estimator 101 until adaptive filter 100 converges to the arbitrary system characteristic. The output of arbitrary system 102 is, therefore, equivalent to the echo signal in an echo canceler application. The output signal of arbitrary system 102 is supplied over lead 109 to another input of filter 100 and therein to a first input of combining network 110. Lead 109 may also include conversion apparatus, e.g., an analog-to-digital converter not shown. A second input to combining network 110 is a signal estimate of the arbitrary system output signal generated by estimator 101. The arbitrary system output estimate is supplied via lead 111 from an output of estimator 101 to the second input of combining network 110. Combining network 110 generates error signal E(K) corresponding to the algebraic difference between the arbitrary system output estimate from estimator 101 and the output from arbitrary system 102. Error signal E(K) is supplied over a second transmission path, e.g., lead 112 to the far end source and to estimator 101.

Estimator 101 includes a so-called tapped delay line comprised of delay units 115-1 through 115-(N−1) (a shift register) for realizing desired delays at the taps corresponding to convenient Nyquist intervals. Therefore, delayed replicas X(K−1) through X(K−N+1) of incoming far end signal X(K) are generated at the corresponding taps. The signal at each tap position, namely X(K−1) through X(K−N+1) as well as X(K), is adjusted in response to error signal E(K). More particularly, signals X(K) through X(K−N+1) are individually weighted in response to E(K) via a corresponding one of adjustment networks 116-0 through 116-(N−1), respectively. Adjustment networks 116-0 through 116-(N−1) each include multipliers 117 and 118, and feedback loop 119. Feedback loop 119 adjusts the tap weight to a desired value in a manner which will be apparent to those skilled in the art and explained in the above-noted references. In this adjustment, it is important to appropriately adjust the individual loop gains (G) to result in a stable system. This is realized by normalizing loop gain G by dividing it with an estimate of a prescribed characteristic of input signal X(K). In this example, an estimate of input signal power P(X) is employed as a normalization control signal and generated by power estimator 104. Normalization control signal P(X) is supplied to controllable gain unit 121 in each of adjustment networks 116. See for example, the article entitled "A Twelve-Channel Digital Echo Canceler" noted above which discloses use of an average, i.e., a long term estimate P(X) of the power of X(K) to normalize loop gain G, namely, G/P(X). The weighted replicas, i.e., amplitude coefficient signals of X(K) from adjustment networks 116-0 through 116-(N−1) are summed via summing network 120 to generate the arbitrary system output or echo estimate signal approximating the output from arbitrary system 102 or the echo to be canceled. The arbitrary system estimate is supplied via lead 111 to the second input of combining network 110.

Figure 2:
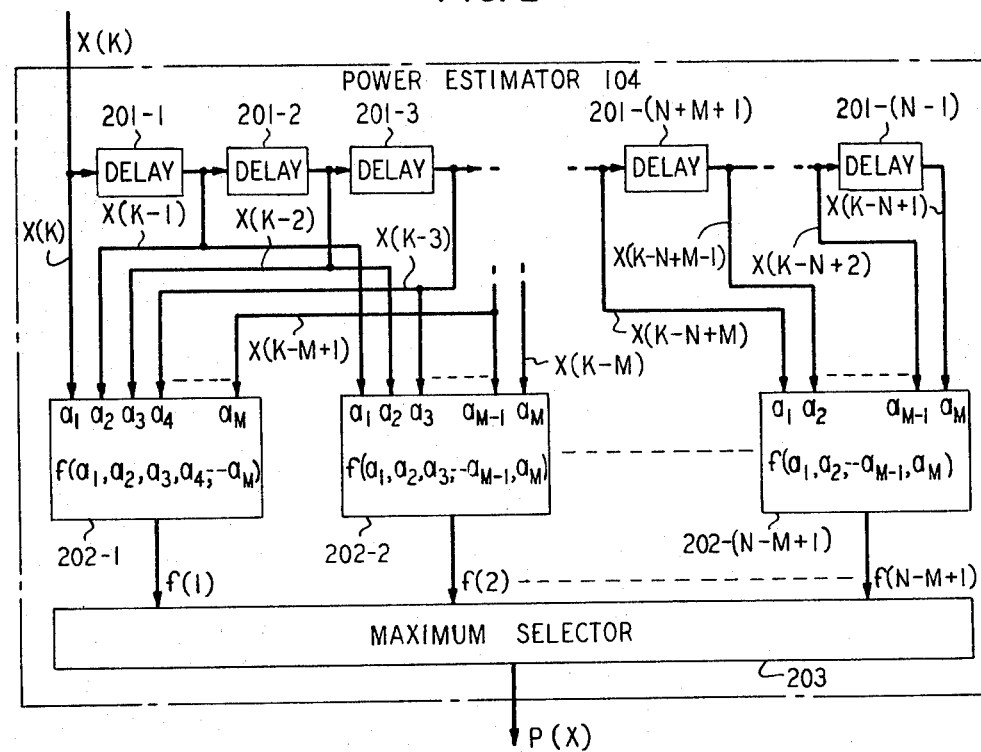
FIG. 2 depicts in simplified form details of one embodiment of the power estimator employed in FIG. 1.

FIG. 2 shows in simplified block diagram form one embodiment of power estimator 104 which may be utilized, in accordance with an aspect of the invention, to generate a representation of a fast attack estimate of a prescribed characteristic of received signal X(K). In this example, not to be construed as limiting the scope of the invention, the prescribed characteristic of signal X(K) is a power estimate P(X). As indicated above, estimator 104 is employed, in accordance with an aspect of the invention, to generate a fast attack estimate of power P(X) of X(K). Power estimate P(X) is supplied to each of adjustment networks 116 (FIG. 1) for normalizing update gain G in well known fashion, namely, G/P(X).

Accordingly, shown in FIG. 2 are a plurality of delay elements 201-1 through 201-(N−1) for example, a shift register for generating N delayed versions of received signal sample X(K), namely, X(K−1) through X(K−N+1). The delay interval is equal to the sampling interval. Predetermined ones, i.e., subsets of received signal samples X(K) through XL(K−N+1), are supplied to individual ones of function generators 202-1 through 202-(N−M+1) to generate a corresponding plurality of short term estimates of the prescribed characteristic of X(K). In this example, each of function generators 202 generates a short term estimate of power of X(K) from a subset of samples, namely $$f(a1, a2, \ldots aM) = \frac{1}{M} \sum_{i=1}^{M} (ai)^2 \quad (1)$$

where $ai = X(1-i+1)$,
1 is the time index of the first sample of the M sample block or subset supplied to the individual ones of function generators 202, and $M \leq N$. Since $M \leq N$ there are $N-M+1$ blocks or subsets of M consecutive samples which can be used in generating power estimates. When transient or rapidly pulsating signals are received the mean square power estimate over all of the amplitude samples stored in delay elements 201, i.e., the average power estimate, is too small a value for normalizing the filter loop update gain without the possibility of the filter becoming unstable. What is desired is to generate the mean square power estimate only over the samples including the transient or pulsating signal amplitude values, i.e., a fast attack power estimate. This is achieved, in accordance with an aspect of the invention, by selecting the number of samples M in a block or subset to be a predetermined number which represents a so-called window of the samples in delay elements 201. In this example, the windows overlap to insure that if a representation of the transient or pulsating signal is stored in elements 201, it will be captured. Stated another way, a window of M samples is essentially shifted along delay elements 201, in this example, one element at a time to generate simultaneously a plurality of power estimates corresponding to the plurality of windows of M samples. Since the mean square average of the samples in a window or subset including the transient or pulsating signal is significantly larger than the power in the other windows, the desired fast attack power estimate P(X) is readily obtained by selecting the maximum level. Thus, function generator 202-1 is supplied with the current sample X(K) through sample X(K−M+1) to generate power estimate f(1) in accordance with equation 1. Similarly, function generator 202-2, is supplied with the first delayed sample X(K−1) through sample X(K−M) to generate power estimate f(2) in accordance with equation 1. This procedure is iterated until finally function generator 202-(N−M+1) is supplied with sample X(K−N+M) through sample X(K−N+1) to generate power estimate f(N−M+1), also in accordance with equation 1. Therefore, function generators 202-1 through 202-(N−M+1) simultaneously generate a plurality of short term estimates of input signal power each of which is the average of the sum of the squares of the magnitudes of M samples of the received signal as indicated in equation 1. In one example, N=128 and M=16. Apparatus for generating the average of the sum of the squares of a plurality of samples is known in the art. See for example, the article entitled, "A Twelve-Channel Digital Echo Canceler", noted above.

Outputs f(1) through f(N−M+1) from function generators 202 are supplied to selector 203. Selector 203 is employed to select from f(1) through f(N−M+1) in accordance with a prescribed criterion signal P(X) which is representative of a fast attack estimate of the prescribed characteristic of input signal X(K). In this example, selector 203 is employed to select as P(X) the maximum of signals f(1) through f(N−M+1) each of which represents a short term estimate of power of input signal X(K). Selecting the maximum from the plurality of short term power estimates is straightforward. For example, the maximum is readily obtained by comparing each value of f(1) through f(N−M+1) in turn with the largest of the previous values starting with an initial value of zero. Thus, for i=1 to N−M+1, if f(i)>f (max), set f (max)=f(i). Fast attack power estimate P(X) is supplied to normalize the update gain, namely, G/P(X), in gain unit 121 in each of adjustment networks 116-0 through 116-(N−1) (FIG. 1).

Figure 3:
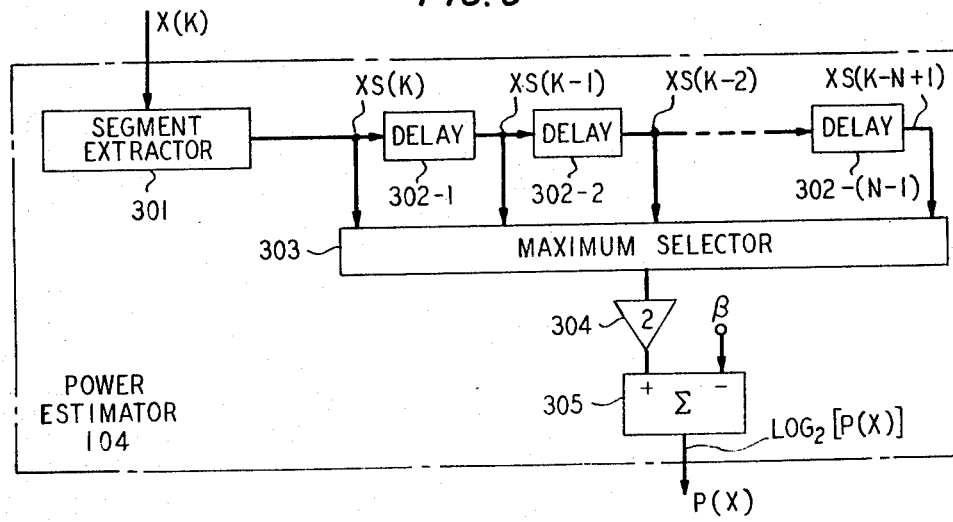
FIG. 3 shows in simplified block diagram form details of another embodiment of the power estimator of FIG. 1.

FIG. 3 shows in simplified form another embodiment of power estimator 104 for generating a normalization control signal which, in this example, is representative of a fast attack power estimate P(X) of received signal X(K). Specifically, referring to equation 1, M=1 and N=128. Received signal X(K), typically includes samples of a signal in digital form each representative of a μ-law quantized amplitude sample. Each such digital sample representation includes a sign bit, three segment bits and four step bits.

As described above, a mean square power estimate of the transient of pulsating signal is desired. It is known that peak power is approximately related to the mean square estimate by a so-called crest factor γ, namely, that $$P(X) = \frac{P(X)MAX}{\gamma^2} \qquad (2)$$

It is also known that subtraction is simpler than multiplication. Therefore, if representations of the logarithms of P(X)MAX and γ² are available, the desired mean square fast attack power estimate is obtainable by subtracting the logarithms. It is also known that for μ-law digital representations of amplitude samples, the segment bits are an approximate representation of the log base 2 of the corresponding sample magnitude, see for example, U.S. Pat. No. 4,189,715 issued to D. L. Duttweiler on Feb. 19, 1980.

Accordingly, as shown in FIG. 3, received signal sample X(K) is supplied to segment extractor 301 for obtaining the segment bits of the received samples. This is readily realized by employing a corresponding plurality of gates which are enabled to pass only the three segment bits to delay element 302-1 and, in turn, to delay elements 302-2 through 302-(N−1). Delay elements 302 may be a shift register for storing N delayed replicas of the segment bits XS(K), namely, XS(K−1) through XS(K−N+1). As described above, segment bits XS(K) through XS(K−N+1) are approximately representative of the logarithms of the magnitudes of the corresponding samples. The maximum of signals XS(K) through XS(K−N+1) is obtained via maximum selector 303 in well-known fashion and, in turn, supplied via amplifier 304 to a summing input of summer 305. Amplifier 304 has a gain in this example of two (2). Consequently, the output of amplifier 304 is approximately 2 log₂ X(K)MAX or representative of P(X)MAX. Signal β is supplied to a subtracting input of summer 305. Signal β is selected to be 2 log₂ γ where γ is the crest factor or peak factor, in this example, for a speech signal. Such a crest factor value is readily obtained by a computer simulation in well known fashion. It should be noted that selection of the crest factor for speech is somewhat of a compromise because the crest factor is different for other type signals, e.g., sine waves and noise. The ideal situation is to adjust the crest factor for each such type of received signal. This is not practical at this time. Thus, an output from summer 305 is approximately representative of log₂ P(X), where P(X) is the desired short term power estimate. The log₂ P(X) signal is supplied to be subtracted from the logarithm of gain G in gain unit 121 in each adjustment networks 116-0 through 116-(N−1) (FIG. 1) to realize the normalization of the update gain, namely, G/P(X).

What is claimed is:
1. In an adaptive transversal filter of the type including:
   a plurality of means each for generating a corresponding one of a plurality of amplitude coefficient signals, said plurality of amplitude coefficient signals forming an impulse response, each of said amplitude coefficient signal generating means including controllable gain means responsive to a normalization control signal for normalizing gain used in updating said corresponding amplitude coefficient signal;
   means responsive to a received signal for generating the normalization control signal, said normalization control signal generating means including,
   means for generating a plurality of representations of a prescribed characteristic of the received signal and
   means for selecting one of said plurality of representations in accordance with a prescribed criterion as said normalization control signal.

2. The invention as defined in claim 1 wherein said representations of a prescribed characteristic are representations of power estimates and wherein said prescribed criterion is to select the maximum value of said power estimates as the normalization control signal.

3. The invention as defined in claim 2 wherein said representations of power estimates are each representative of peak power of portions of the received signal.

4. The invention as defined in claim 2 wherein said representations of power estimates are each representative of mean square power of portions of the received signal.

5. The invention as defined in claim 1 wherein said received signal includes a sequence of amplitude samples, said means for generating a plurality of representations includes means for generating said plurality of representations from subsets of said amplitude samples, each subset comprising a predetermined number of said amplitude samples.

6. The invention as defined in claim 5 wherein said predetermined number of amplitude samples is at least one, said prescribed characteristic is power, and said prescribed criterion is to select the maximum of the plurality of power representations.

7. The invention as defined in claim 5 wherein said predetermined number is a plurality of amplitude samples, said prescribed characteristics is mean square power of the plurality of amplitude samples in each subset, and said prescribed criterion is to select the maximum mean square power.

8. The invention as defined in claim 1 wherein said received signal includes a sequence of amplitude samples, wherein said means for generating a plurality of representations includes means for storing a plurality of magnitude representations of said received signal samples, wherein said means for selecting comprises means for selecting at least one of said stored magnitude representations in accordance with a first criterion, and wherein said normalization control signal generating means further includes means for modifying said at least one selected magnitude representation in accordance with a second criterion to generate said normalization control signal.

9. The invention as defined in claim 8 wherein said first criterion includes selecting the maximum value of said stored magnitude representations and said second criterion includes scaling said selected maximum value by a predetermined scaling factor.

10. The invention as defined in claim 9 wherein said scaling factor is a crest factor selected for a speech signal and said stored magnitude representations are representative of the logarithms of the magnitudes of the corresponding amplitude samples.

11. In an adaptive transversal filter of the type including:
   a plurality of means each for generating a corresponding one of a plurality of amplitude coefficient signals, said plurality of amplitude coefficient signals forming an impulse response, each of said amplitude coefficient signal generating means including controllable gain means responsive to a normalization control signal for normalizing gain used in updating said corresponding amplitude coefficient signal;
   means responsive to a received signal for generating said normalization control signal, said normalization control signal generating means including
   means for generating a fast attack power estimate of the received signal and
   means for supplying said fast attack power estimate as said normalization control signal to said controllable gain means in each of said amplitude coefficient signal generating means.

12. The invention as defined in claim 11 wherein said fast attack power estimate generating means comprises means for generating a short term power estimate of the received signal.

13. The invention as defined in claim 12 wherein said short term power estimate generating means includes means for generating a plurality of power estimates of the received signal and means for selecting the maximum value of said power estimates as said short term power estimate.

14. The invention as defined in claim 13 wherein said power estimates each represent peak power of portions of the received signal.

15. The invention as defined in claim 13 wherein said power estimates each represent mean square power of portions of the received signal.

16. The invention as defined in claim 13 further including means for scaling said selected maximum value by a predetermined scaling factor.

* * * * *